US006856186B2

(12) United States Patent
Schamberger

(10) Patent No.: US 6,856,186 B2
(45) Date of Patent: Feb. 15, 2005

(54) CIRCUIT CONFIGURATION FOR LEVEL BOOSTING, IN PARTICULAR FOR DRIVING A PROGRAMMABLE LINK

(75) Inventor: Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/600,916

(22) Filed: Jun. 20, 2003

(65) Prior Publication Data

US 2004/0027189 A1 Feb. 12, 2004

Related U.S. Application Data

(63) Continuation of application No. PCT/DE01/04781, filed on Dec. 19, 2001.

(30) Foreign Application Priority Data

Dec. 20, 2000 (DE) .......................................... 100 63 686

(51) Int. Cl.[7] .............................................. H03L 5/00
(52) U.S. Cl. ..................................... 327/333; 327/525
(58) Field of Search ................................ 327/333, 525, 327/526; 326/62, 63, 10; 365/225.7, 185.09, 185.23

(56) References Cited

U.S. PATENT DOCUMENTS

| | | | | |
|---|---|---|---|---|
| 5,245,576 A | * | 9/1993 | Foss et al. ................... | 365/200 |
| 5,293,561 A | | 3/1994 | Nizaka .................... | 365/189.11 |
| 5,313,424 A | | 5/1994 | Adams et al. .............. | 365/200 |
| 5,448,187 A | | 9/1995 | Kowalski ...................... | 326/81 |
| 5,583,456 A | * | 12/1996 | Kimura ....................... | 326/115 |
| 5,696,728 A | | 12/1997 | Yu et al. ...................... | 365/218 |
| 5,777,491 A | * | 7/1998 | Hwang et al. ............... | 326/113 |
| 5,821,800 A | | 10/1998 | Le et al. ...................... | 327/333 |
| 5,844,298 A | | 12/1998 | Smith et al. ................. | 257/330 |
| 5,920,205 A | * | 7/1999 | Bushehri et al. ............ | 326/115 |
| 5,986,951 A | * | 11/1999 | Park et al. ................... | 365/200 |
| 6,222,384 B1 | | 4/2001 | Kim ............................ | 326/68 |

FOREIGN PATENT DOCUMENTS

| | | |
|---|---|---|
| DE | 693 01 225 T2 | 5/1994 |
| DE | 198 25 034 A1 | 4/1999 |
| EP | 0 388 074 A1 | 9/1990 |
| EP | 0 798 860 A2 | 10/1997 |

(List continued on next page.)

OTHER PUBLICATIONS

Joo–Sun Choi et al.: "Antifuse EPROM Circuit for Field Programmable DRAM", *2000 IEEE International Solid-State Circuits Conference, pp. 406–407*.

Jae–Kyung Wee et al.: "An Antifuse EPROM Circuitry Scheme for Field–Programmable Repair in DRAM", *IEEE Journal of Solid–State Circuits, vol. 35, No. 10, Oct. 2000, pp. 1408–1414*.

*Primary Examiner*—Tuan T. Lam
(74) *Attorney, Agent, or Firm*—Laurence A. Greenberg; Werner H. Stemer; Ralph E. Locher

(57) ABSTRACT

A circuit configuration is provided for level boosting, in particular for driving a link that can be programmed by an energy pulse, which is also referred to as a fuse. The circuit configuration has a circuit for level boosting and also a logic circuit. The logic circuit combines a first input signal with a second input signal and controls an input of the circuit for level boosting, the output level of an output signal of the circuit for level boosting being greater than the input level. A fusible link can be connected to an output terminal of the circuit for level boosting. Since an input stage of the circuit for level boosting is at the same time a first subcircuit of the logic circuit, the circuit configuration enables an exceptional component and area-saving construction. This has an advantageous effect particularly in mass memory chips.

9 Claims, 1 Drawing Sheet

FOREIGN PATENT DOCUMENTS

| | | |
|---|---|---|
| JP | 60018018 | 1/1985 |
| JP | 62081185 | 4/1987 |
| JP | 02128514 | 5/1990 |
| JP | 02180426 | 7/1990 |
| JP | 04145720 | 5/1992 |
| JP | 05308274 | 11/1993 |
| JP | 08046508 | 2/1996 |
| JP | 11195974 | 7/1999 |
| WO | 98/35444 | 8/1998 |

* cited by examiner

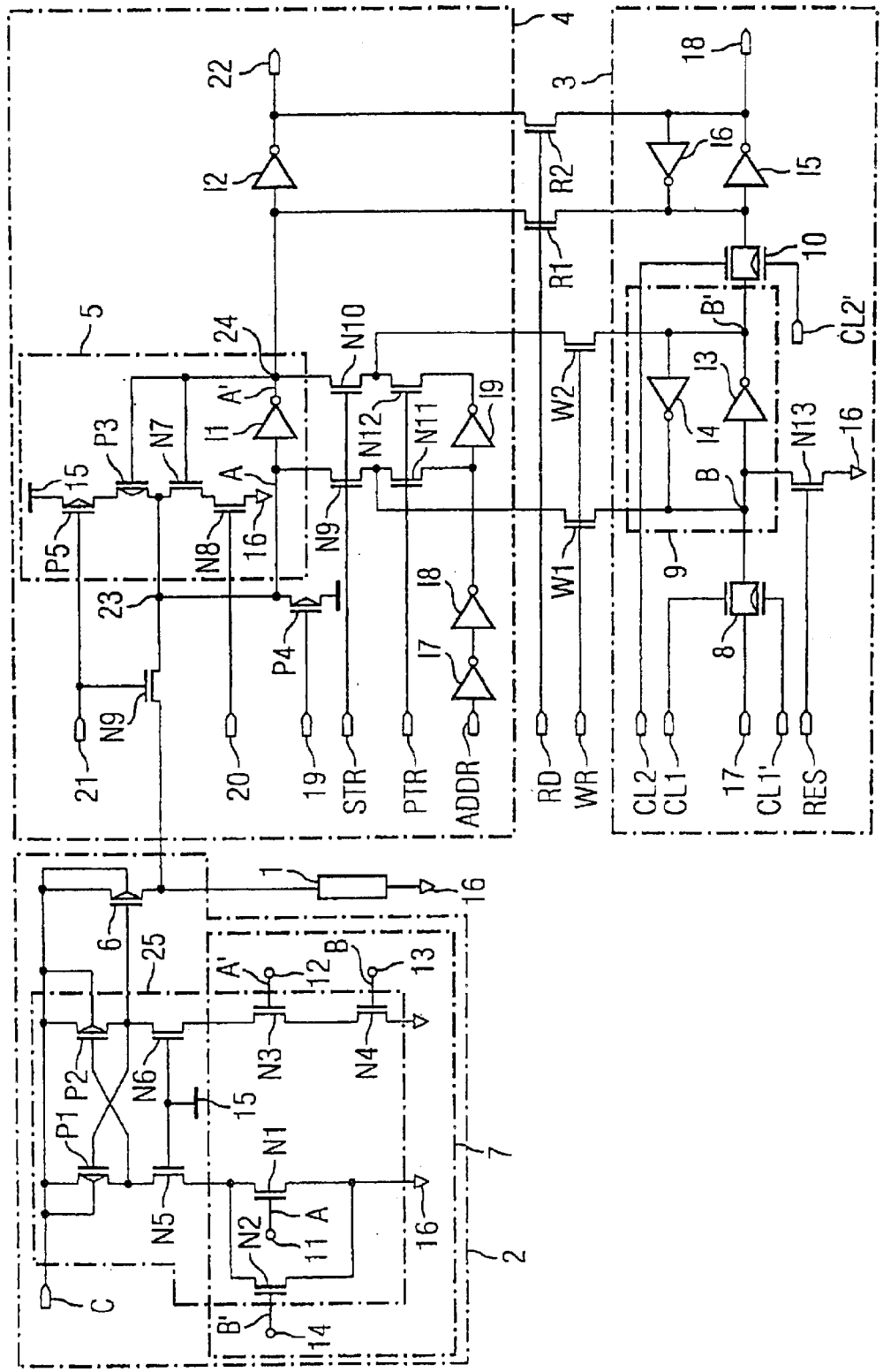

CIRCUIT CONFIGURATION FOR LEVEL BOOSTING, IN PARTICULAR FOR DRIVING A PROGRAMMABLE LINK

CROSS-REFERENCE TO RELATED APPLICATION

This application is a continuation of copending International Application No. PCT/DE01/04781, filed Dec. 19, 2001, which designated the United States and was not published in English.

BACKGROUND OF THE INVENTION

Field of the Invention

The present invention relates to a circuit configuration for level boosting, in particular for driving a link that can be programmed by an energy pulse.

In memory chips, for example in synchronous dynamic random access memories (SDRAMs) having a memory space of 256 megabits, for example, replacement memory cells are usually provided for the purpose of providing redundancy. The replacement memory cells can be used to replace defective memory cells by redundant, intact memory cells. What are usually provided for this purpose are so-called fuses, fusible links, which can be programmed for example by lasers or by electrical pulses. A few thousand of these fuses are provided in a 256 MB RAM, by way of example.

In the case of the programmable links, a distinction is made between fuses, which can be permanently changed over from a low-impedance to a high-impedance state of conduction by an energy pulse, and antifuses, which can be permanently changed from a non-conducting to a conducting state by an energy pulse.

The blowing or activation of fusible links is usually a one-time, irreversible operation. The operation has usually been effected hitherto by activation by lasers prior to encapsulation of the memory chip with a plastic housing. Accordingly, it is no longer possible to repair defective memory cells after encapsulation of the chip.

Fusible links that can be activated electrically can also be activated or blown after encapsulation of a chip. However, an impermissibly high current consumption through simultaneous blowing of a plurality of fuses must be avoided in this case.

Drive circuits may be provided for driving one or more fuses and for providing an energy pulse. Since several thousand fuses may be provided in a memory chip, it is particularly important to be able to realize such drive circuits with a small number of components.

SUMMARY OF THE INVENTION

It is accordingly an object of the invention to provide a circuit configuration for level boosting, in particular for driving a programmable link which overcomes the above-mentioned disadvantages of the prior art devices of this general type, which enables the driving of one or more fuses with a small chip area, a small number of components and low current consumption.

With the foregoing and other objects in view there is provided, in accordance with the invention, a circuit for driving a link being programmable by an energy pulse. The circuit generates an output signal with a boosted signal level compared with a logic level of an input signal. The circuit contains an input stage having a first input terminal pair for receiving a first input signal with a logic level, and a second input terminal pair for receiving a second input signal with a logic level. The input stage has a first switch pair with control inputs forming the first input terminal pair. The input stage has a second switch pair connected to the first switch pair for forming a logic combination of the first and second input signals, and the second switch pair has control inputs forming the second input terminal pair. An output stage is connected to the input stage. The output stage has a terminal for feeding in a blowing voltage, a first supply voltage terminal, and an output terminal coupled to the link and the output signal with the boosted signal level can be tapped at the output terminal.

In accordance with the circuit principle described, a logic circuit which combines two input signals with one another is provided. By way of example, the input signals may be a data signal, which provides the information that is to be permanently stored, and an activation signal, depending on which a blowing operation for the fusible link may be effected.

The fusible link may be a fuse or as an antifuse.

The circuit for the level boosting of an output level with respect to an input level is advantageous for driving a fusible link particularly when high signal levels, for example a voltage pulse having a large amplitude, are necessary for blowing the fusible link. By way of example, a CMOS logic level of the input signals may lie between 0 volts and 2.5 volts, while the level that may be necessary for driving a blowing transistor is 3.5 volts. In accordance with the principle described, components can be saved by virtue of the fact that the input stage of the circuit for level boosting is at the same time a subcircuit of the logic circuit. Even if this saves only one or two transistors or other components per drive circuit, this nevertheless has a significant effect on the overall circuit in a mass application such as in a memory chip to the extent that the overall circuit has a significantly smaller chip area requirement and significantly lower current requirement. Moreover, the manufacturing outlay is significantly reduced.

In a preferred development of the circuit configuration, a switch is provided, having a control input, which is connected to the output terminal of the circuit for level boosting and, depending on the input signals, through-connects one terminal of its controlled path, to which a blowing voltage can be fed, to a further terminal of its controlled path, which can be connected to the programmable link. On account of the circuit for level boosting, by which the switch can be driven, reliable switching and inhibiting is made possible in the case of the switch. Such a switch makes it possible, in particular, to provide a voltage pulse for blowing a fuse or antifuse. The switch may be embodied for example as a CMOS field-effect transistor whose gate terminal may be connected to the output terminal of the circuit for level boosting. If the fusible link is an antifuse, then the blowing thereof effects an irreversible transition of the fusible link from a high-impedance to a low-impedance state of conduction. By contrast, if the fusible link is a fuse, then blowing thereof effects the irreversible transition from a low-impedance to a high-impedance state of conduction.

In a further preferred embodiment of the present invention, the input stage contains two transistors as a first switch pair, of which a first input transistor can be driven by the first input signal and a second input transistor can be driven by the inverted first input signal. The input signal may accordingly be present as a complementary input signal pair. The inverted first input signal may be obtained from the first input signal in a simple manner by inversion. However, the further processing of a complementary input signal pair in the input stage is particularly advantageous when the input signal pair is present in inverted form anyway, as may be the case anyway in circuit configurations for driving a link that can be programmed by an energy pulse. The component saving is particularly large in this case.

In a further preferred embodiment of the present invention, the circuit for level boosting contains two cross-coupled transistors coupled to the input transistors. In this case, cross-coupled transistors are understood to be two transistors of which the control input of one transistor is respectively connected to a terminal of a controlled path of the respective other transistor in a negative feedback. The further terminals of the controlled paths of the cross-coupled transistors may be connected to a supply voltage terminal, in particular to a terminal for feeding in a blowing voltage.

In a further preferred embodiment of the present invention, two further transistors, connected to a first supply voltage terminal by their control inputs, are provided for the purpose of coupling the cross-coupled transistors to the input transistors. In order to realize the circuit for level boosting, the further transistors may be connected to a fixed potential by their control inputs, for example a positive fixed supply voltage of the circuit configuration. The supply voltage may be lower than the blowing voltage.

In a further preferred embodiment of the present invention, the second subcircuit of the logic circuit contains two transistors, of which a third input transistor can be driven by the second input signal and a fourth input transistor can be driven by the inverted second input signal. The description already given above for the first input signal that can be fed in as complementary input signal pair applies, mutatis mutandis, to the second input signal that can be fed in as a complementary input signal pair.

Whereas the first input signal or first input signal pair may be used to provide for example the information that is to be permanently stored by the fusible link, the second input signal or the second input signal pair may be used to provide for example an activation signal which may indicate an activation or a blowing operation for the fusible link.

In a further preferred embodiment of the present invention, first and fourth input transistors are connected up in parallel with one another, and second and third input transistors in series with one another, in order to form an AND combination.

In a further preferred embodiment of the present invention, the circuit configuration contains a shift register, which provides a complementary activation signal pair and is connected to control inputs of the third and fourth input transistors for the purpose of communicating the signal pair. In this case, the shift register may have a register cell realized for example with two negative feedback inverters. In this case, the complementary activation signal pair is provided in inverted form and in non-inverted form anyway without any additional outlay.

Moreover, an impermissibly high current in the circuit configuration can be effectively avoided by the activation of drive circuits for fusible links with a shift register, because the individual shift registers, which may in each case be assigned to a drive circuit which drives one or more fusible links, may be connected up in series with one another to form a shift register chain. As a result of this, a bit pattern generator that can be connected to the shift register chain on the input side can provide a bit pattern which enables a temporal control of the order of the blowing of the individual fusible links by the respectively assigned drive circuits.

In a further preferred embodiment of the present invention, the circuit configuration contains a volatile memory cell, which provides a complementary data signal pair and is connected to control inputs of the first and second input transistors for the purpose of communicating the signal pair. The volatile memory cell, in the same way as the register cell, may advantageously be configured as a feedback inverter which forms a latch with self-latching. As a result of this, the complementary data signal pair is provided in an inverted form and in a non-inverted form anyway without any additional outlay on circuitry. Consequently, in a simple manner, an item of information to be programmed can be permanently stored by the fusible link directly by the volatile memory via the drive circuit. This does not require complicated individual selection and addressing of the fusible link.

In a further preferred embodiment of the present invention, the circuit configuration is constructed using CMOS circuit technology.

Other features which are considered as characteristic for the invention are set forth in the appended claims.

Although the invention is illustrated and described herein as embodied in a circuit configuration for level boosting, in particular for driving a programmable link, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a circuit diagram of an exemplary embodiment of a circuit configuration according to the invention.

DESCRIPTION OF THE PREFERRED EMBODIMENTS

Referring now to the single FIGURE of the drawing in detail, there is shown a programmable link 1, which is configured as an antifuse and is connected to a supply voltage terminal 16 by one terminal and to a drive circuit 2 by a further terminal. The drive circuit 2 is connected to a shift register 3 for the feeding in of an activation signal B, B'. Furthermore, a volatile memory 4 is provided, which, on the one hand, is connected to the further terminal of the antifuse 1 for reading out the state thereof and, on the other hand, is connected to the drive circuit 2 for feeding in a data signal A, A' at a data input 11, 12.

The drive circuit 2 contains an AND logic circuit 7, which combines the data signal A, A' and the activation signal B, B' with one another in a logical AND combination. Two NMOS transistors N1, N2 connected in parallel are provided for this purpose, of which a first NMOS transistor N1 has a control input connected to a data input 11, and a second NMOS transistor N2 has a control input having an activation input 14 for feeding in the activation signal B. Furthermore, further NMOS transistors N3, N4 are provided in the AND logic circuit 7 for feeding in respectively complementary or inverse data and activation signals A', B', which transistors are connected in series by their controlled paths, and of which transistors a first NMOS transistor N3 has a control input connected to a data input 12 for feeding in the complementary data signal A', and a second NMOS transistor N4 has a control input connected to an activation input 13 for feeding in a complementary activation signal B'.

The NMOS transistors N1, N3 with the data inputs 11, 12 are simultaneously part of a circuit for level boosting 25 which, on the control side, is connected to a blowing transistor 6. The circuit for level boosting 25, which is part of the drive circuit 2, has two cross-coupled PMOS transistors P1, P2, which are connected to the AND logic circuit 7 via further NMOS transistors N5, N6. On the output side of the circuit for level boosting 25 there is connected the blowing transistor 6 embodied as a PMOS transistor which is connected by a load terminal to the antifuse 1 and also to the volatile memory 4 for reading out the state of the antifuse 1.

The volatile memory 4 contains a memory cell 5 formed from two inverters I1; P3, N7 connected to one another. In this case, a first inverter I1 is provided, at whose input 23 the data signal A can be derived and at whose output 24 the complementary or inverse data signal A' can be derived. A PMOS transistor P3 and an NMOS transistor N7, whose control inputs are connected to one another and to the output of the first inverter I1, form the second inverter, whose output is connected to the input of the first inverter I1 at the circuit node 23. The inverters I1 and P3, N7 thus form, as a memory cell, a feedback latch with self-latching.

At the memory cell 5, auxiliary inputs 19, 20, 21 are provided for the purpose of reading out the present state of the antifuse 1. First, with the auxiliary input 19 and a PMOS transistor P4 connected thereto by its control input, for reading out the state of the antifuse 1, a logic 1 is written to the memory cell 5 and self-latched there. Afterward, with auxiliary inputs 20, 21, which drive mutually complementary CMOS transistors P5, N8 of the memory cell 5, a tristate state is formed in the memory cell 5, which connects the memory cell 5, in particular the inverter P3, N7, to the supply voltage terminals 15, 16 in a high-impedance manner. The NMOS transistor N9 is conducting at the same time, which transistor is likewise connected to the auxiliary input 21 for its control and is connected between a terminal of the antifuse 1 and an input of the memory cell 5. This has the effect that the circuit node at the input of the first inverter I1 in the memory cell 5 remains at high impedance if the antifuse 1 is likewise at high impedance, and undergoes transition to a low-impedance state if the antifuse 1 configured as an antifuse is at low impedance, that is to say has already blown. In the latter case, the input node of the first inverter I1, which provides the data signal A, discharges via transistor N9 and the antifuse 1, which is conducting in this case. As soon as the state of the antifuse 1, that is to say whether the antifuse is conducting at a low impedance or at a high impedance, is read out as logic 0 or 1 into the memory cell 5, the signals applied to the auxiliary inputs 20, 21 for this purpose are removed and the memory cell 5 undergoes transition to self-latching again. By an inverter I2, which is connected to the output of the first inverter I1 by its input, the data signal A or the inverse data signal A' can be read out from memory cell 5 at an output 22. Furthermore, the memory cell 5 is coupled to an address input ADDR, which, on the input side, is connected to three series-connected inverters I7, I8, I9. Furthermore, for coupling the address input ADDR to the memory cell 5, two pairs of NMOS transistors N9, N10; N11, N12 are provided, the control inputs of which are connected to a strobe input STR and to a pointer input PTR. By use of strobe and pointer signals on the selection lines Strobe STR, Pointer PTR, a bit of an address of a memory cell of an SDRAM, for example, can be written to the memory cell 5, in which case the memory cell in the SDRAM to which points the address of which one bit can be fed in at the input ADDR may be defective. If the address is defective, then the bit of the relevant defective memory cell address which is present at the address input ADDR can be written to the memory cell 5 by selection lines strobe, pointer, STR, PTR, which can be activated for this purpose.

Permanent storage of the bit of the address of the defective memory cell cannot be made possible with the memory cell 5, however, since the latter only forms a volatile memory. Therefore, the drive circuit 2 described enables the read-out of the memory cell 5, that is to say of the data signal A, A' via the AND control logic 7 already described and also the permanent storage of the datum read out by the blowing transistor 6 in the antifuse 1. In this case, the AND logic circuit 7 combines the data signal A, A' with an activation signal B, B' in an AND combination. Consequently, the antifuse 1 is blown only when a logic 1 is stored in memory cell 5 and, in addition, a logic 1 is provided by the activation signal B, B' at the activation input 13, 14. Finally, a blowing operation for the antifuse 1 in accordance with the exemplary embodiment also requires a blowing voltage C to be present at the PMOS transistors P1, P2, which form the level boosting circuit already described, and at the blowing transistor 6.

In accordance with the present invention, the activation signal B, B' can then be provided by the shift register 3 in the register cell 9, which likewise has two negative feedback inverters I3, I4 which form a self-latching circuit. A switch 8, 10 embodied as a PMOS transfer gate is respectively connected to the input of the register cell 9 and to the output of the register cell 9. While the switch 8 connected on the input side can be driven by a first clock signal CL1, CL1', the switch 10 disposed on the output side can be driven by a second clock signal CL2, CL2', which can be fed to the switch 10. The memory content of the register cell 9 can be reset via an NMOS transistor N13, which connects the input of the memory cell 9 to a supply voltage terminal 16, and which is connected to a reset input RES on the control side. On the output side of the register cell 9 and connected downstream of the output-side switch 10, the shift register 3 has a further self-latching circuit, which is realized with two likewise negative feedback inverters I5, I6 and couples the switch 10 to an output 18 of the shift register 3. The input of the shift register 3 that is connected to an input of the input-side switch 8 is designated by 17.

As already described, memory cells in SDRAM chips, which may have a memory space of 256 megabits, for example, are selected by use of addresses. Such an address may have 25 bits, for example. Accordingly, 25 of the circuits shown in the FIGURE, containing the antifuse 1, the drive circuit 2, the volatile memory 4 and the shift register 3, are necessary for the addressing of an individual memory cell of an SDRAM chip. However, in order to avoid an impermissibly high current flow, which may momentarily amount to approximately 1 mA per antifuse, during the blowing of the antifuses 1, the individual drive circuits 2 for the antifuses 1 with shift register 3 may be selected or addressed successively or partly simultaneously. For this purpose the plurality of shift registers 3 can be connected to one another in a series circuit, in which case an input 17 of one shift register circuit 3 can respectively be connected to an output 18 of another shift register circuit 3. A shift register chain is formed as a result of this. The register cells 9 respectively connected to one another via switches 8, 10 can also be interpreted as a register. A bit pattern generator, not depicted in the present FIGURE, may be connected to the input of the first register cell. If only one antifuse is permitted to be blown at any one time, then a bit sequence which has only one logic 1 and is filled with zeros can be provided by the bit pattern generator at the input of the shift register chain. The logic 1 is then successively shifted through all the register cells 9 of the shift register, so that only one drive circuit 2 is activated at that time in each case by the respective activation signal B. The clock signals CL1, CL1' and CL2, CL2' are provided for controlling the sequence. If a plurality of antifuses 1 can be blown simultaneously, then it is also possible, of course, by use of shift register 3, for a plurality of directly successive ones or ones spaced apart by zeros at an adjustable interval to be shifted through the shift register chain.

The circuit configuration described, with the fast volatile memory 4, enables a correction of defective memory cells in a mass memory chip in real time. By way of example, before the mass memory chip is switched off, the respective addresses of the defective memory cells can be written permanently, for which purpose the drive circuits 2 and the antifuse 1 are provided. Consequently, blowing of the antifuses 1 for the permanent storage of defective addresses, more precisely addresses of defective memory cells, is made possible. This is still possible even after the encapsulation and housing of the mass memory chip, since the antifuse 1 is electrically drivable. Finally, the invention affords the advantage that not only can an impermissibly high blowing current occur as a result of the simultaneous blowing of too many antifuses, but that in addition an arbitrary number of antifuses 1 can be blown simultaneously and in an arbitrary order by bit patterns that can be generated arbitrarily and can be shifted through the register cells 9.

Furthermore, the control terminals of two read transistors R1, R2 are connected to a read input RD. In this case, the controlled path of the first read transistor R1 couples the input of the further memory cell I5, I6 of the shift register 3 to the input of the second inverter I2 at the output of the memory cell 5. The second read transistor R2, by its controlled path, couples the output of the further memory cell I5, I6 of the shift register 3 to the output of the second inverter I2 and thus the output 22 of the volatile memory 4. Consequently, upon activation of the read line at the read input RD, the data stored in the memory cell 5 or the bit stored in memory cell 5 can be read out and written to the latch I5, I6, operated with self-latching, in a simple manner. For data transfer in the opposite direction, a respective control input of a respective first and second write transistor W1, W2, configured as NMOS transistors in the same way as the read transistors R1, R2, is connected to a write input WR. In this case, the controlled path of the first write transistor W1 couples the input of the register cell 9 to an input of the memory cell 5 and the second write transistor W2, by its controlled path, couples the output of the register cell 9 of the shift register 3 to an input of the memory cell 5 in the volatile memory 4.

The write and read transistors described bring about, in a simple manner, a coupling for bidirectional data transfer between the memory cell 5 and the register cell 9, that is to say between the volatile memory 4 and the shift register 3. Consequently, in conjunction with a particularly low area requirement, the shift register 3 fulfills a dual function: on the one hand, the memory cell 5 can be read from and written to simply and rapidly, and, on the other hand, an information item for activating the blowing transistor 6 for blowing the programmable link 1 configured as an antifuse can be communicated by the shift register.

I claim:

1. A circuit for driving a link being programmable by an energy pulse, the circuit generating an output signal with a boosted signal level compared with a logic level of an input signal, the circuit comprising:

an input stage having a first input terminal pair for receiving a first input signal with a logic level, and a second input terminal pair for receiving a second input signal with a logic level, said input stage having a first switch pair with control inputs forming said first input terminal pair, said input stage having a second switch pair connected to said first switch pair for forming a logic combination of the first and second input signals, said second switch pair having control inputs forming said second input terminal pair;

an output stage connected to said input stage and having a terminal for feeding in a blowing voltage, a first supply voltage terminal, and an output terminal coupled to the link and the output signal with the boosted signal level is tapped at said output terminal; and a switch having a control input and a controlled path with a first terminal connected to said terminal for feeding in the blowing voltage and a second terminal connected to the link, said control input of said switch connected to said output terminal of said output stage and, depending on the first and second input signals, said switch through-connects said first terminal of said controlled path, connected to said terminal for feeding in the blowing voltage, to said second terminal of said controlled path connected to the link.

2. The circuit according to claim 1, wherein said first switch pair has two input transistors including a first input transistor driven by the first input signal and a second input transistor driven by an inverted first input signal.

3. The circuit according to claim 2, wherein said output stage includes two cross-coupled transistors coupled to said input transistors.

4. The circuit according to claim 3, wherein said output stage further includes two further transistors having control inputs connected to said first supply voltage terminal, said two further transistors coupling said cross-coupled transistors to said input transistors.

5. The circuit according to claim 2, wherein said second switch pair includes two further input transistors including a third input transistor driven by the second input signal and a fourth input transistor driven by an inverted second input signal.

6. The circuit according to claim 5, wherein said first and fourth input transistors are connected up in parallel with one another, and said second and third input transistors are connected in series with one another and said first, second, third and fourth transistors form an AND combination.

7. The circuit according to claim 5, wherein said third and fourth transistors have control inputs; and further comprising a shift register generating the second input signal and the inverted second input signal and connected to said control inputs of said third and fourth input transistors for transmitting the second input signal and the inverted second input signal.

8. The circuit according to claim 2, wherein said first and second transistors have control inputs; and further comprising a volatile memory cell providing the first input signal and the inverted first input signal and connected to said control inputs of said first and second input transistors for transmitting the first input signal and the inverted first input signal.

9. The circuit according to claim 1, wherein the circuit configuration is constructed using CMOS circuit technology.

* * * * *